US009247669B2

United States Patent
Hsieh

(10) Patent No.: US 9,247,669 B2
(45) Date of Patent: Jan. 26, 2016

(54) ADD-IN CARD FIXING FRAME

(71) Applicant: ASRock Rack Inc., Taipei (TW)

(72) Inventor: Chi-Kang Hsieh, Taipei (TW)

(73) Assignee: ASROCK RACK INC., Taipei (TW)

( * ) Notice: Subject to any disclaimer, the term of this patent is extended or adjusted under 35 U.S.C. 154(b) by 0 days.

(21) Appl. No.: 14/663,515

(22) Filed: Mar. 20, 2015

(65) Prior Publication Data

US 2015/0342079 A1 Nov. 26, 2015

(30) Foreign Application Priority Data

May 21, 2014 (TW) .............................. 103208870 U

(51) Int. Cl.
*H05K 7/14* (2006.01)
*H05K 7/18* (2006.01)

(52) U.S. Cl.
CPC ............ *H05K 7/1461* (2013.01); *H05K 7/1418* (2013.01); *H05K 7/18* (2013.01)

(58) Field of Classification Search
CPC ..... H05K 7/14; H05K 7/1402; H05K 7/1404; H05K 7/1405; H05K 7/1407; H05K 7/1408; H05K 7/1409; H05K 7/1418; H05K 7/1461; H05K 7/18
See application file for complete search history.

(56) References Cited

U.S. PATENT DOCUMENTS

| | | | | |
|---|---|---|---|---|
| 5,575,546 A * | 11/1996 | Radloff | ................... | G06F 1/184 312/183 |
| 6,349,039 B1 * | 2/2002 | Boe | ...................... | F16B 5/0635 24/290 |
| 6,608,765 B2 * | 8/2003 | Vier | ..................... | H05K 7/1429 361/752 |
| 6,618,264 B2 * | 9/2003 | Megason | ............. | H05K 7/1405 200/336 |
| 6,950,313 B1 * | 9/2005 | Shih | ..................... | H05K 7/1409 361/679.31 |
| 6,972,370 B2 * | 12/2005 | Wang | ...................... | G06F 1/184 174/535 |
| 7,110,253 B2 * | 9/2006 | Fan | ......................... | G06F 1/184 361/679.32 |
| 7,120,028 B2 * | 10/2006 | Hsu | ......................... | G06F 1/181 248/552 |
| 7,289,318 B2 * | 10/2007 | Hsiao | ...................... | G06F 1/184 211/41.17 |
| 7,855,898 B2 * | 12/2010 | Tang | ....................... | G06F 1/186 312/223.2 |

(Continued)

FOREIGN PATENT DOCUMENTS

CN 2785029 5/2006
TW I285526 8/2007

OTHER PUBLICATIONS

English translation of abstract of TW I285526 (published Aug. 11, 2007).

(Continued)

*Primary Examiner* — Joshua Rodden
(74) *Attorney, Agent, or Firm* — McClure, Qualey & Rodack, LLP

(57) ABSTRACT

An add-in card fixing frame includes a frame body, one or more attached locking assemblies, and one or more limit switches. The frame body includes a first side plate, a second side plate, one or more separating plates, and one or more connecting portions. The separating plate includes one or more protruding part having an opening. The attached locking assembly includes a main plate, a top plate, and one or more side plates having a through hole and a locking member. When the add-in card is fixed, the locking member passes through a first screw hole, a second screw hole for fixing, and the add-in card is sandwiched between the top plate and the connecting portion. The top plate presses the limit switch for power connection. The attached locking assembly is fixed to the frame body, so use of hand tools is unnecessary. The screw falling out can be avoided.

12 Claims, 5 Drawing Sheets

(56) References Cited

U.S. PATENT DOCUMENTS

| | | | | |
|---|---|---|---|---|
| 8,382,215 B2* | 2/2013 | Chen | G06F 1/186 312/223.2 |
| 9,066,438 B2* | 6/2015 | Chen | H05K 7/1405 |
| 2004/0037048 A1* | 2/2004 | Liao | H05K 7/1409 361/726 |
| 2005/0265007 A1* | 12/2005 | Gordon | G06F 1/184 361/755 |
| 2006/0198115 A1 | 9/2006 | Chen et al. | |
| 2008/0055866 A1* | 3/2008 | Chou | H05K 7/1408 361/732 |
| 2008/0278907 A1* | 11/2008 | Shih | G06F 1/186 361/679.4 |
| 2009/0262508 A1* | 10/2009 | Fukui | H05K 7/1408 361/759 |
| 2009/0296363 A1* | 12/2009 | Dai | G06F 1/186 361/801 |
| 2010/0014266 A1* | 1/2010 | Yeh | H05K 7/1408 361/801 |

OTHER PUBLICATIONS

English translation of abstract of CN 2785029 (published May 31, 2006).

* cited by examiner

ADD-IN CARD FIXING FRAME

CROSS-REFERENCES TO RELATED APPLICATIONS

This non-provisional application claims priority under 35 U.S.C. §119(a) on Patent Application No. 103208870 filed in Taiwan, R.O.C. on 2014 May 21, the entire contents of which are hereby incorporated by reference.

BACKGROUND

1. Technical Field

The present invention is related to an add-in card fixing frame, especially to an add-in card fixing frame including an attached locking assembly and a limit switch.

2. Related Art

With the development of the industrial computer and cloud computing, in order to increase PC or Server performance, or to reduce the motherboard load, it is very common to add various cards, such as a sound card or display card. The add-in card(s) is usually assembled to the socket(s) on the motherboard and fixed to the outside of the case frame, so as to maintain firmly both mechanical strength and electrical connection. The traditional add-in card uses an L-shaped fixing structure and/or a screw nut to fix the card on the outside of the case frame. However, if the screw/screw nut falls out when being tightened, or due to being inadequately tightened during insertion, it may cause damage or short circuit to the components on the add-in card or on the motherboard. These effects may cause a PC or Server to crash. Additionally, the data stored in the PC or the Server may be rendered inaccessible, so the users of the PC or the Server may be inconvenienced.

Usually, the add-in card(s) is assembling to the outer frame while the PC or Server is powered off; power on the PC or Server after the add-in card is assembled to the outer frame. However, if the add-in card is inadequately tightened during insertion, it is necessary to disconnect the electric power from the PC or Server in order to remove and re-insert the add-in card. The computer component life may be reduced by repeatedly switching on and off of the electric power. Thus, there is a need for a structure or a method to solve the above problems of avoiding screws falling out, and avoiding powering the computer on and off repeatedly.

SUMMARY

The main objective of the present invention is to provide an add-in card fixing frame for fixing an add-in card. The add-in card fixing frame comprises a frame body, at least one attached locking assembly, and at least one limit switch. The frame body comprises a first side plate, a second side plate, at least one separating plate, and at least one connecting portion. The first side plate is parallel to the second side plate. Each of the at least one separating plate connects respectively to the first side plate and the second side plate. Each separating plate comprises at least one protruding part having an opening. The at least one connecting portion connects to the first side plate and extends from the junction of the first side plate connecting to the at least one separating plate. The at least one connecting portion comprises a first screw hole and a receiving hole.

Each attached locking assembly comprises a main plate, a top plate, at least one side plate, and a locking member. The top plate comprises a second screw hole and is extended along a second direction from a first edge of the main plate. Each side plate comprises a through hole corresponding to the opening and is extended along the second direction from a second edge and/or a third edge perpendicular to the first edge of the main plate. The locking member passes through the second screw hole. When in fixing, the locking member is fixed within the first screw hole, and an add-in card may be sandwiched between the top plate and the connecting portion.

The at least one limit switch is fixed within the at least one receiving hole. The through hole on the side plate is aligned with the opening to be riveted, and each side plate is connected to each protruding par. Thus, when the add-in card is not fixed to the add-in card fixing frame, the attached locking assembly is fixed on the frame body. When the add-in card is fixed on the top plate, the second screw hole of the attached locking assembly is aligned with the first screw hole. The locking member can ensure the add-in card is sandwiched between the top plate and the connecting portion. After the add-in card is fixed on the top plate, the second direction is opposite to the first direction, and the top plate presses the limit switch for power connection.

Accordingly, hand tools are unnecessary when adding and fixing the add-in card to the add-in card fixing frame of the present invention. Users need only pull the attached locking assembly to a specific position and rotate the screw protecting cover to fix the screw. Thus, the attached locking assembly is fixed onto the frame body, which may avoid the problem of the screw falling out. Additionally, the power connection may be set with a time delay by using the firmware of the PC main board. Thus, after the limit switch confirms the specific time has passed, the power turns on. This can avoid the problem of powering the computer on and off repeatedly.

DETAILED DESCRIPTION

Figure 1:
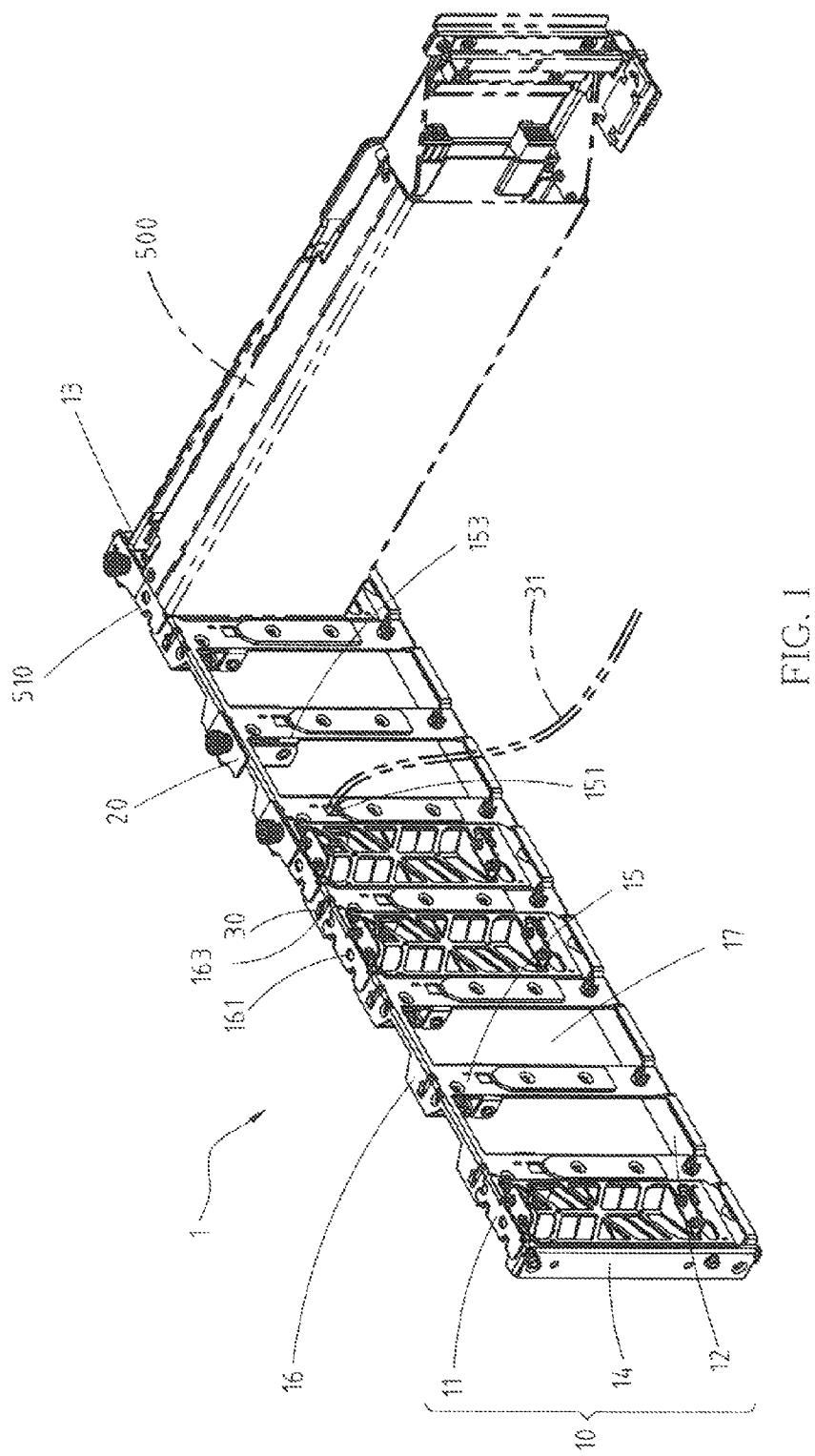
FIG. 1 is a front schematic diagram showing an add-in card fixing frame according to the present invention.
Figure 2:
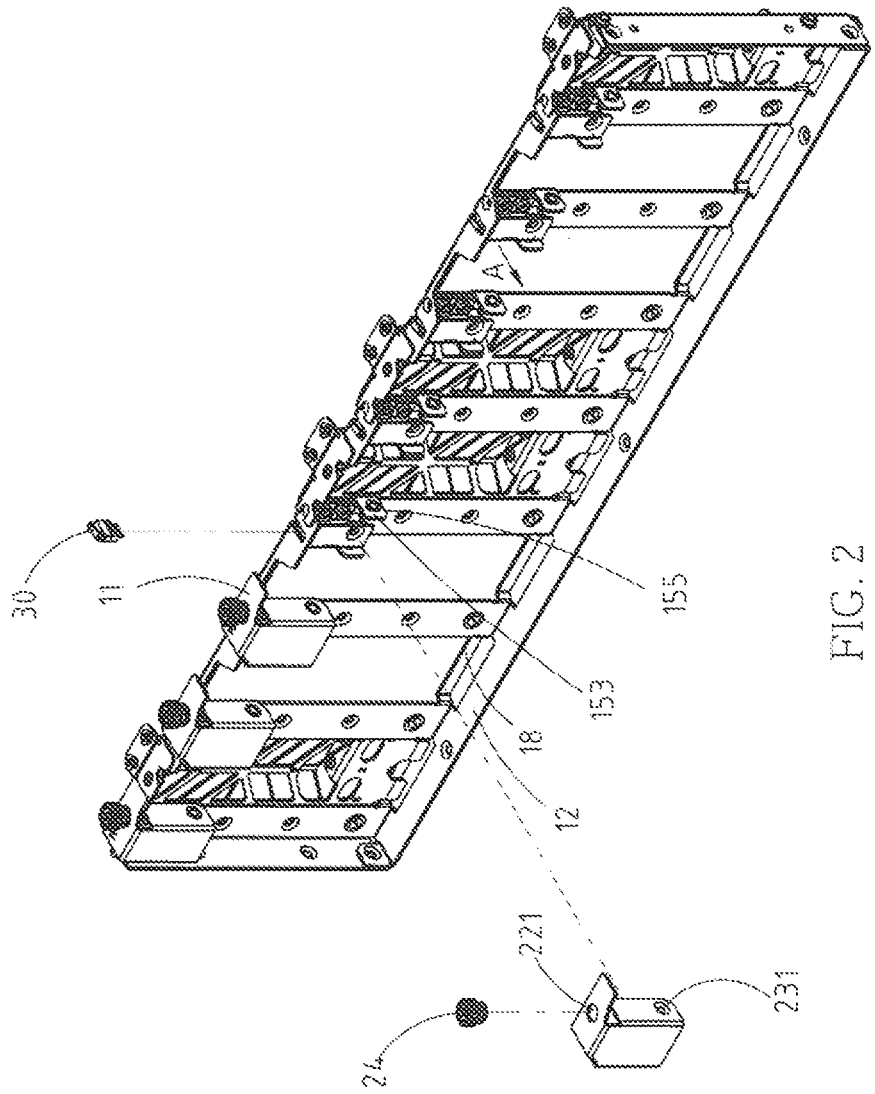
FIG. 2 is a rear schematic diagram showing an add-in card fixing frame according to the present invention.

Please refer to FIGS. 1 and 2, showing an add-in card fixing frame according to the present invention with a front schematic diagram and a rear schematic diagram, respectively. As shown in FIGS. 1 and 2, the add-in card fixing frame 1 comprises a frame body 10, at least one attached locking assembly 20, and at least one limit switch 30, wherein the at least one attached locking assembly 20 and the at least one limit switch 30 are fixed on the frame body 10.

The frame body 10 comprises a first side plate 11, a second side plate 12, a third side plate 13, a fourth side plate 14, at least one separating plate 15, and at least one connecting portion 16, wherein the first side plate 11 and the second side plate 12 are parallel to each other, the third side plate 13 is connected respectively to one end of the first side plate 11 and one end of the second side plate 12, and the fourth side plate 14 is connected respectively to the other end of the first side plate 11 and the other end of the second side plate 12. Accordingly the frame body 10 is substantially a rectangle frame.

Each separating plate 15 is connected to the first side plate 11 and second side plate 12, respectively. Each separating plate 15 is parallel to the third side plate 13 and the fourth side plate 14, so as to separate the frame body 10 for forming a plurality of receiving opening 17. Each separating plate 15 comprises a through opening 151. A surface of each separating plate 15 comprises least one protruding part 153 extending along a first direction A, wherein the first direction A is perpendicular to the surface of each separating plate 15. Each protruding part 153 comprises an opening 155. Each connecting portion 16 is connected to the first side plate 11 and extending along the first direction A from the junction of each separating plate 15 connecting to the first side plate 11. Each connecting portion 16 comprises a first screw hole 161 and a receiving hole 163. The connections among the first side plate 11, the third side plate 13, the second side plate 12, the fourth side plate 14, each separating plate 15, and each connecting portion 16 can be formed by integrally molding, riveting, or screwing. The connections are described for examples and not limited the present invention.

The frame body 10 comprises a plurality of connecting bar 18 located respectively at one side of each separating plate 15 and crossing each receiving opening 17 for connecting each separating plate 15, so as to enhance the mechanical strength.

Figure 3:
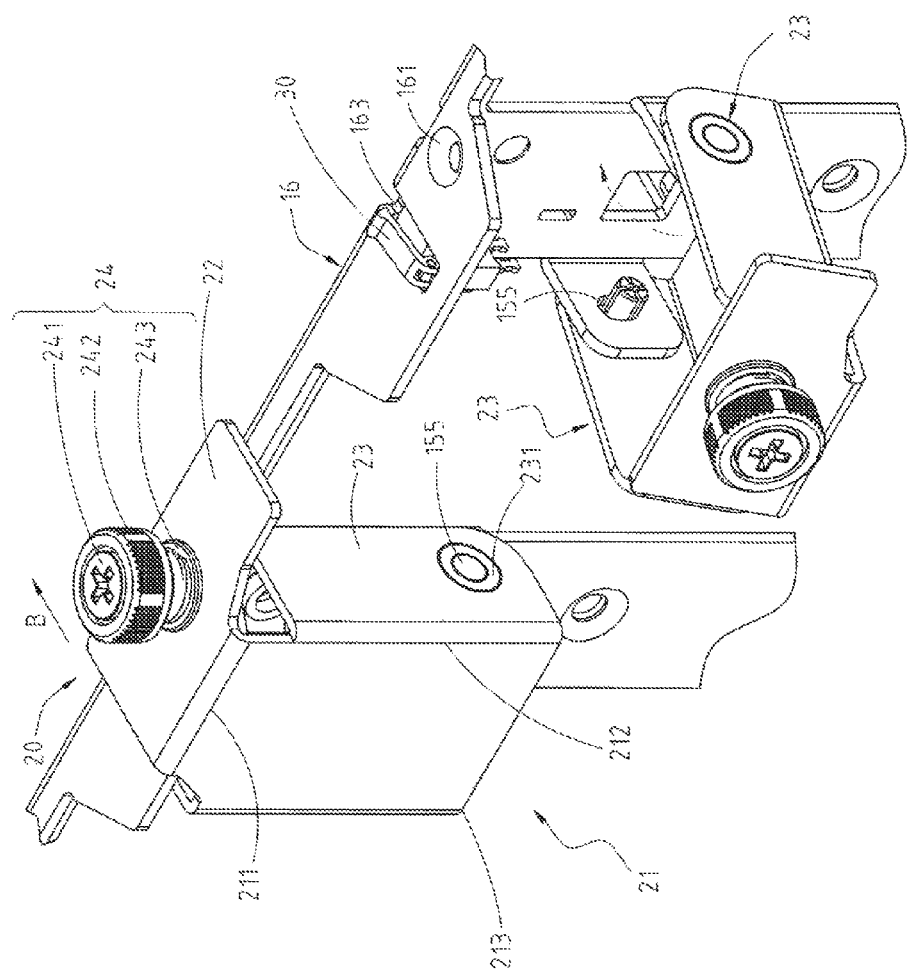
FIG. 3 is a schematic diagram of an attached locking assembly according to an embodiment of the present invention.

Please refer to FIG. 3, showing a schematic diagram of an attached locking assembly according to an embodiment of the present invention. Please also refer to FIGS. 1 and 2. Each attached locking assembly 20 comprises a main plate 21, a top plate 22, at least one side plate 23, and a locking member 24. The top plate 22 comprises a second screw hole 221 and is extended along a second direction from a first edge 211 of the main plate 21. Each side plate 23 comprises a through hole 231 and is extended along the second direction from a second edge 212 and/or a third edge 213 of the main plate 21, wherein the second edge 212 and the third edge 213 both are perpendicular to the first edge 211. The through hole 231 on the side plate 23 is corresponding to the opening 155.

The locking member 24 comprises a screw 241 and a protecting cover 242. The screw 241 passes through the second screw hole 221. The protecting cover 242 covers the screw 241. The protecting cover 242 is larger than the second screw hole 221, so the locking member 24 can be fixed on the top plate 22. Additionally, the locking member 24 comprises an elastic member 243, such as a spring, located between the locking member 24 and the top plate 22. Thus, when in use, users need only hold the protecting cover 242 and rotate the screw 241 by one hand without any tools such as screwdriver. Additionally, the elastic member 243 can be used for pressing and fixing the screw. The structure of the present invention can avoid the screw falling out.

As shown in FIG. 2 and FIG. 3, the through hole 231 aligns with the opening 155 to be riveted. Each side plate 23 is connected to each protruding part 153, so as to fix each attached locking assembly 20 onto each protruding part 153. When an add-in card 500 is to be fixed into the present invention, a connection base 510 of the add-in card 500 is placed on the connecting portion 16. Then, the attached locking assembly 20 is moved (pivoted), and the locking member 24 passes through the second screw hole 221 and is fixed within the first screw hole 161. Accordingly, the connection base 510 is sandwiched between the connecting portion 16 and the top plate 22. The opening 155 is ellipse-shaped for providing tolerance to adjust the fixing position of the attached locking assembly 20 and the connecting portion 16. When the attached locking assembly 20 is fixed onto the frame body 10, one or more fixing elements can be omitted. This is convenient for users when adding the add-in card 500.

Figure 4:
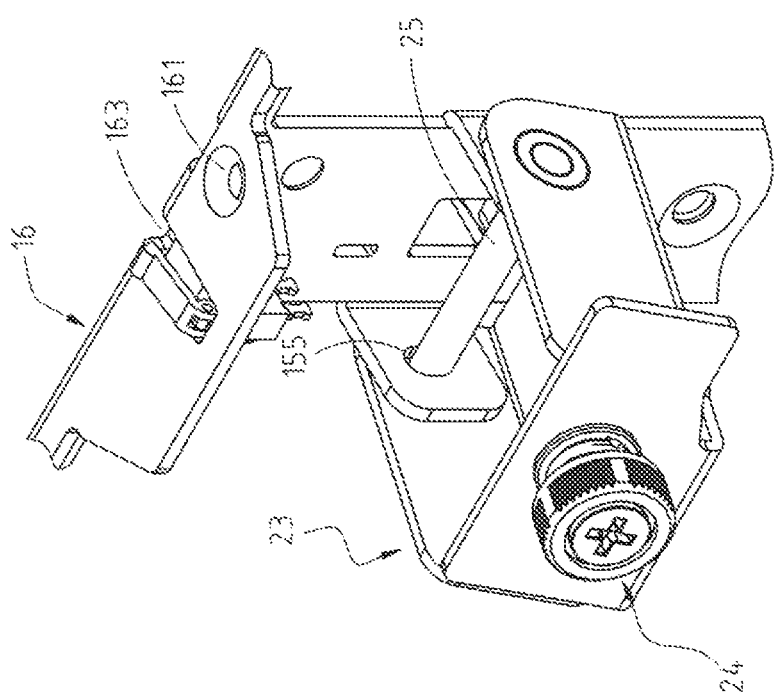
FIG. 4 is a schematic diagram of an attached locking assembly according to another embodiment of the present invention.

Please refer to FIG. 4, which shows a schematic diagram of an attached locking assembly according to another embodiment of the present invention. The embodiment showing in FIG. 4 is similar to the embodiment showing in FIG. 3, the main difference is FIG. 4 showing a pivot axis passing through the opening 155 and the through hole 231 and pivoted the protruding part 153 and the side plate 23. The embodiments showing in FIG. 3 and FIG. 4 both can allow the attached locking assembly 20 pivoting. Please also refer to FIG. 3. When the attached locking assembly 20 is fixed on to the connecting portion 16, the above-mentioned second direction will be fixed as the B direction (as shown FIG. 3), which is opposition to the direction A.

Please again refer to FIGS. 1 to 3. The limit switch 30 is fixed within the receiving hole 163. A conductive line 31 of the limit switch 30 passes through the through opening 151 and assembles to a power socket of a PC main board (not shown). When the limit switch 30 is fixed without pressing, it is in the status of power disconnected. When pressing the limit switch 30, it is in the status of power connected. When the attached locking assembly 20 is fixed to the connecting portion 16, the top plate 22 presses the limit switch 30 to establish the power connection. A waiting period before the power is connected, such as five seconds, can be set using the PC motherboard's firmware. This can prevent power connection errors and avoid the problem of powering the computer on and off repeatedly. When the add-in card 500 is connected, it can prevent electric shocks occurring.

Figure 5:
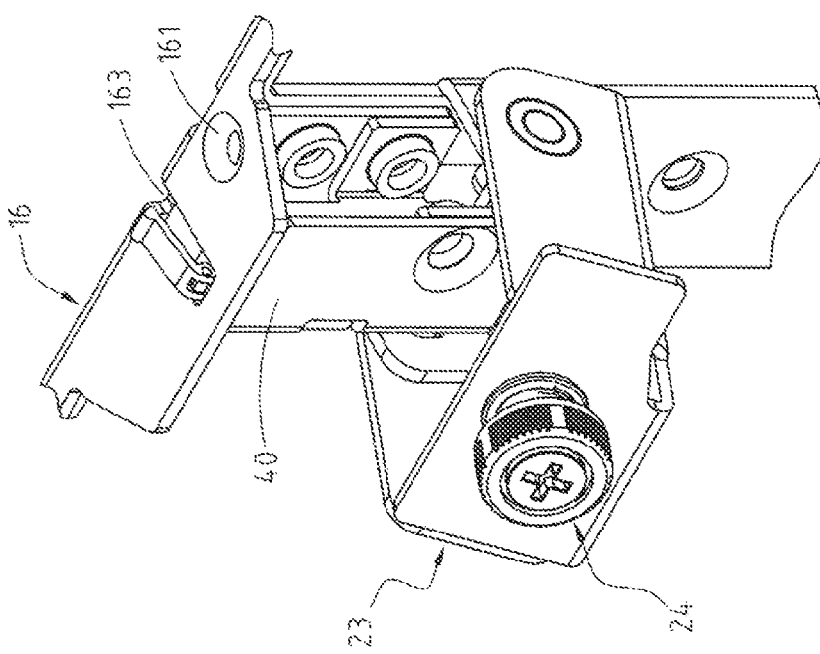
FIG. 5 is a schematic diagram showing a protecting case according to the present invention.

Additionally, please refer to FIG. 5 showing a schematic diagram showing a protecting case according to the present invention. The add-in card fixing frame 1 according to the present invention further comprises at least one protecting case 40 connecting to the first side plate 11 and/or the separating plate 15. The protecting case 40, first side plate 11 and/or the separating plate 15 surround the limit switch 30 for fixing the limit switch 30 within the receiving hole 163 and on the protecting case 40. When the attached locking assembly 20 is fixed to the connecting portion 16, the protecting case 40 is surrounded by the main plate 21, the top plate 22, and the side plate 23.

The feature of the present invention is (but not limited to), saving tools when adding and fixing the add-in card to the add-in card fixing frame of the present invention. A user need only pull the attached locking assembly to a specific position and rotate the screw protecting cover to fix the screw, the first screw hole, and the second screw hole. Thus, the attached locking assembly is fixed onto the frame body, which may avoid the problem of the screw falling out. Additionally, the power connection may be set with a time delay using the firmware of the PC motherboard. Thus, after the limit switch confirms the specific time has elapsed, the power turns on. This can avoid the problem of powering the computer on and off repeatedly.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An add-in card fixing frame for fixing at least one add-in card comprising:
    a frame body comprising a first side plate, a second side plate, at least one separating plate, and at least one connecting portion, wherein the first side plate is parallel to the second side plate, the at least one separating plate connects respectively to the first side plate and the second side plate, the at least one separating plate comprises at least one protruding part having an opening, the at least one connecting portion connects to the first side plate and extends from the junction of the first side plate connecting to the at least one separating plate, and the at least one connecting portion comprises a first screw hole and a receiving hole;

at least one attached locking assembly comprising a main plate, a top plate, at least one side plate, and a locking member, wherein the top plate comprises a second screw hole and is extended from a first edge of the main plate, the side plate comprises a through hole corresponding to the opening and is extended from a second edge or a third edge perpendicular to the first edge of the main plate, so as to pivot the side plate to the protruding part and the locking member passes through the second screw hole; and at least one limit switch fixed within the at least one receiving hole;

when the locking member is fixed within the first screw hole, the add-in card is sandwiched between the top plate and the connecting portion and the limit switch is pressed by the top plate.

2. The add-in card fixing frame according to claim 1, wherein the through hole is aligned with the opening to be riveted with each other.

3. The add-in card fixing frame according to claim 1, wherein the at least one separating plate comprises two of the protruding parts, the at least one attached locking assembly comprises two of the side plates extending respectively from the second edge and the third edge, a pivot axis passes through the openings of the two protruding parts and the through holes of the two side plates, so as to pivot the protruding parts to the side plate by the pivot axis.

4. The add-in card fixing frame according to claim 1, wherein the opening is ellipse-shaped.

5. The add-in card fixing frame according to claim 1, wherein the locking member comprises a screw and a protecting cover covering the screw, and the protecting cover is larger than the second screw hole.

6. The add-in card fixing frame according to claim 1, wherein the attached locking assembly further comprises an elastic member located between the locking member and the top plate.

7. The add-in card fixing frame according to claim 1 further comprising a third side plate and a fourth side plate, wherein the third side plate and the fourth side plate are parallel to the at least one separating plate, the third side plate is connected respectively to one end of the first side plate and one end of the second side plate, and the fourth side plate is connected respectively to another end of the first side plate and another end of the second side plate.

8. The add-in card fixing frame according to claim 1, wherein the at least one separating plate comprises a through opening for allowing a conductive line of the at least one limit switch to be passed through.

9. The add-in card fixing frame according to claim 1 further comprises a plurality of protecting cases, wherein each protecting case respectively connects to the first side plate and/or the at least one separating plate for surrounding the limit switch;

when the attached locking assembly is fixed to the connecting portion, the protecting case is surrounded by the main plate, the top plate, and the at least one side plate.

10. The add-in card fixing frame according to claim 7, wherein the frame body comprises a plurality of the separating plates and a plurality of connecting bars, the plurality of separating plates are parallel to the third side plate and the fourth side plate for separating a plurality of receiving openings for receiving the add-in card, and the plurality of connecting bars are connected between the plurality of separating plates.

11. The add-in card fixing frame according to claim 7, wherein the first side plate and the second side plate are fixed to the at least one separating plate by screw or rivet.

12. The add-in card fixing frame according to claim 7, wherein the at least one protruding part and the at least one connecting portion are extended along a first direction perpendicular to the first side plate and the separating plate, and the at least one side plate of the attached locking assembly is extended along a second direction perpendicular to the main plate;

when the add-in card is fixed, the second direction is opposite to the first direction.

* * * * *